(12) United States Patent
Ellis

(10) Patent No.: US 9,397,569 B2
(45) Date of Patent: Jul. 19, 2016

(54) CURRENT CONTROL CIRCUIT WITH IN PARALLEL TRANSISTOR MODULES

(71) Applicant: NXP B.V., Eindhoven (NL)

(72) Inventor: Philip Ellis, Stoke on Trent (GB)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/450,062

(22) Filed: Aug. 1, 2014

(65) Prior Publication Data

US 2015/0061620 A1 Mar. 5, 2015

(30) Foreign Application Priority Data

Aug. 30, 2013 (EP) .................................. 13182494

(51) Int. Cl.
*H02M 3/158* (2006.01)
*H03K 17/082* (2006.01)
*H03K 17/12* (2006.01)
*H02M 1/00* (2006.01)
*H02M 3/155* (2006.01)

(52) U.S. Cl.
CPC ............ *H02M 3/158* (2013.01); *H03K 17/0822* (2013.01); *H03K 17/122* (2013.01); *H02M 3/1584* (2013.01); *H02M 2001/0009* (2013.01); *H02M 2003/1555* (2013.01)

(58) Field of Classification Search
CPC ............. H02M 2001/0009; H02M 2003/1555; H02M 3/158; H02M 3/1584
See application file for complete search history.

(56) References Cited

U.S. PATENT DOCUMENTS 5,374,857 A * 12/1994 Carobolante ............. H02P 6/08
327/110
5,889,663 A 3/1999 Tabata et al.
(Continued)

FOREIGN PATENT DOCUMENTS

WO 2006/090333 A1 8/2006

OTHER PUBLICATIONS

NXP B.V. "BUK7109-75AIE", retrieved from the Internet Aug. 19, 2013 at: http://www.nxp.com/products/automotive_mosfets/BUK7109-75AIE.html, 1 pg. (2013).
(Continued)

*Primary Examiner* — Jue Zhang
*Assistant Examiner* — Lakaisha Jackson

(57) ABSTRACT

Consistent with an example embodiment, there is a current control circuit for controlling current flow between a first terminal and second terminal. The current control circuit comprises a current-sensing power MOSFET (metal-oxide semiconductor field effect transistor). Current control is useful for limiting current flow during linear mode operations such as "hotswap", "soft start" and "eFuse" operations, in particular, the reducing of or the preventing of high current surges due to discharged capacitive loads suddenly being switched into circuit. Such current surges can cause supply interference or cause malfunction of sensitive circuits due to the effects of the noise pulse. In extreme cases, fuses may blow or circuit breakers may trip due to the high current surges, therefore taking one or more systems offline.

15 Claims, 2 Drawing Sheets

(56) References Cited

U.S. PATENT DOCUMENTS

Figure 1:
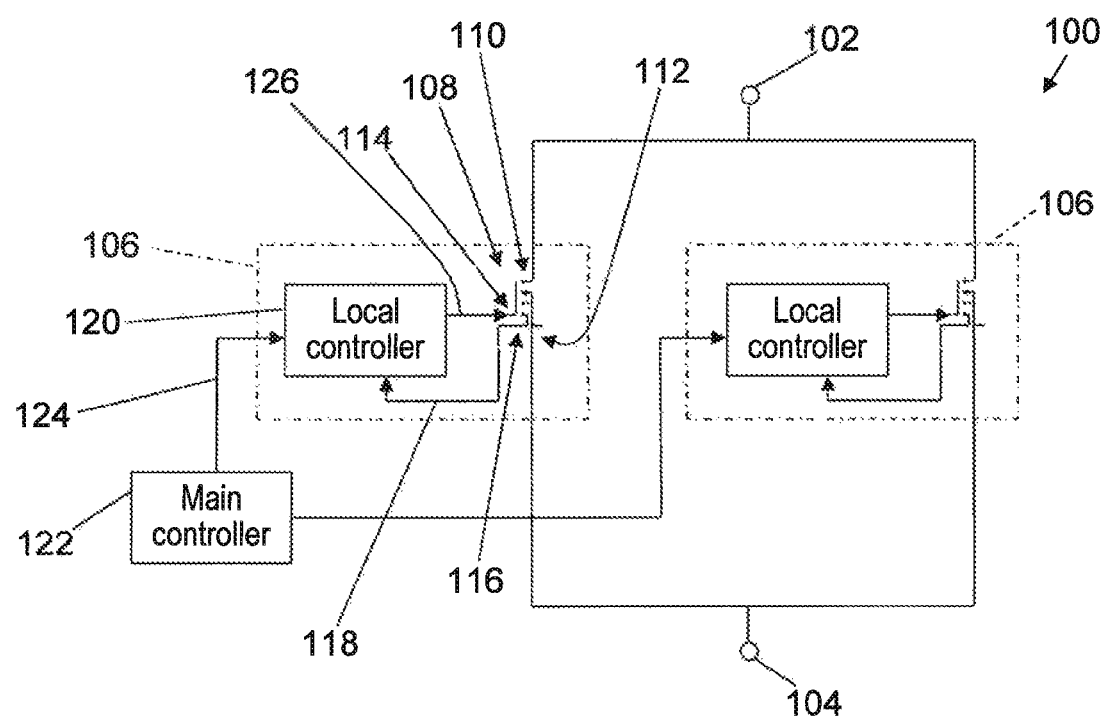

| | | | | |
|---|---|---|---|---|
| 6,324,042 B1* | 11/2001 | Andrews | ............ | G01R 31/00 |
| | | | | 323/283 |
| 6,329,042 B1* | 12/2001 | Yamada | ............ | B05D 5/083 |
| | | | | 428/195.1 |
| 7,737,507 B2 | 6/2010 | Brown | | |
| 2005/0270004 A1* | 12/2005 | Prexl | ............ | H02M 3/1588 |
| | | | | 323/282 |
| 2008/0191779 A1* | 8/2008 | Heppenstall | ....... | H03K 17/0822 |
| | | | | 327/427 |
| 2012/0319484 A1* | 12/2012 | Scaldaferri | ............ | H02J 1/10 |
| | | | | 307/52 |
| 2014/0167797 A1* | 6/2014 | Aerts | ............ | G05F 1/573 |
| | | | | 324/750.3 |
| 2014/0321012 A1* | 10/2014 | Nakayama | ............ | H02M 1/088 |
| | | | | 361/57 |

OTHER PUBLICATIONS

NXP B.V. "Trench 6 Automotive MOSFET Portfolio Extended with Release of 40V / 60V D2PAKs", retrieved from the Internet 7-23-201 at: http://www.nxp.com/news/news-archive/2012/Trench-6-Automotive-MOSFET-portfo . . . , 1-2 pgs. (2012).

Analog Devices "Evaluation Board User Guide UG-263, Evaluating the ADM1275 and ADM1276", 1-12 pgs. (2011).

NXP B.V., "AN10322, Current Sensing Power MOSGETS, Application Note, Rev. 02", retrieved from the Internet Jun. 24, 2009 at: http:/www.nxp.com/documents/application_note/AN10322.pdf. 10 pgs.(Jun. 24, 2009).

Linear Technology Corporation "LT4256—1/LT4256-2, Positive High Voltage Hot Swap Controllers", 1-16 pgs. (2004).

Extended European Search Report for EP Patent Appln. No. 13182494.8 (Mar. 4, 2014).

\* cited by examiner

CURRENT CONTROL CIRCUIT WITH IN PARALLEL TRANSISTOR MODULES

CROSS-REFERENCE TO RELATED APPLICATIONS

This application claims the priority under 35 U.S.C. §119 of European patent application no. 13182494.8, filed on Aug. 30, 2013, the contents of which are incorporated by reference herein.

This disclosure relates to a current control circuit for controlling current flow between a first terminal and second terminal. In particular, although not exclusively, this disclosure relates to a current control circuit comprising a current-sensing power MOSFET (metal-oxide semiconductor field effect transistor).

Current control is useful for limiting current flow during linear mode operations such as "hotswap", "soft start" and "eFuse" operations. in particular, to reduce or prevent high current surges due to discharged capacitive loads suddenly being switched into circuit.

Such current surges can cause supply interference or cause malfunction of sensitive circuits due to the effects of the noise pulse. in extreme cases fuses may blow or circuit breakers may trip due to the high current surges, therefore taking one or more systems offline.

According to a first aspect of the invention there is provided a current control circuit, comprising:
  a first terminal;
  a second terminal;
  a plurality of transistor modules in parallel with each other between the first terminal and the second terminal, each transistor module comprising:
    a main transistor having a main drain, a main source and a main gate, wherein the main source and the main drain define a main source-drain path, the main drain is coupled to the first terminal, the main source is coupled to the second terminal and the main gate is coupled to a local control terminal;
    a sense transistor having a sense drain, a sense source and a sense gate, wherein the sense source and the sense drain define a sense source-drain path, the sense drain is coupled to the first terminal, the sense gate is coupled to the local control terminal, and the sense source is configured to provide a local feedback signal;
    a local controller configured to:
      receive the local feedback signal and a main control signal; and
      provide a local control signal to the local control terminal in accordance with the local feedback signal and the main control signal in order to control the current through the main source-drain path and the sense source-drain path.

The current control circuit can advantageously reduce the amount of power that is consumed in measuring the current through the circuit, Also, the likelihood that any of the transistors is operated outside of its safe operating (SOA) is reduced because of the improved current sharing due to the local control of each transistor module.

The local controller may be configured to determine the local control signal in accordance with a difference between the local feedback signal and the main control signal.

The local feedback signal may be representative of the current flowing through the sense transistor, which may also be representative of the current flowing through the main transistor.

The main control signal may be representative of a desired current level for the sense transistor or the transistor module. The local controller of each of the plurality of transistor modules may he configured to receive the same main control signal.

The local control signal may be configured to control the current such that the current through the sense source-drain path tends towards a desired current level represented by the main control signal.

The main transistor and the sense transistor may be provided on a common die. The main transistor and the sense transistor may comprise a current sensing transistor such as a current sensing power MOSFET.

An area of the main transistor may be at least an order of magnitude greater than an area of the sense transistor, and optionally a plurality of orders of magnitude greater, An area of the drain of the main transistor may be at least an order of magnitude greater than the area of the drain of the sense transistor, and optionally a plurality of orders of magnitude greater.

The local controller may include a difference amplifier comprising two inputs that respectively receive signals from a Kelvin source contact of the main transistor and the sense source of the sense transistor; and an output that provides the local feedback signal The current control circuit may further comprise a main controller. The local may be configured to provide a main feedback signal to the main controller. The main controller may be configured to provide the main control signal in accordance with the main feedback signals received from the plurality of transistor modules. The main feedback signal may be representative of the current through the sense transistor.

The main controller may be configured to:
  determine a maximum power that can be applied to the main transistor and sense transistor such that they stay within their safe operating areas in accordance with the main feedback signal; and
  set the main control signal in accordance with the determined maximum power.

There may be provided a module configured for plugging into a backplane power supply, the module comprising any current control circuit disclosed herein.

There may be provided a soft start circuit for controlling a current flow to a capacitive load, the soft start circuit comprising any current control circuit disclosed herein.

Figure 2:
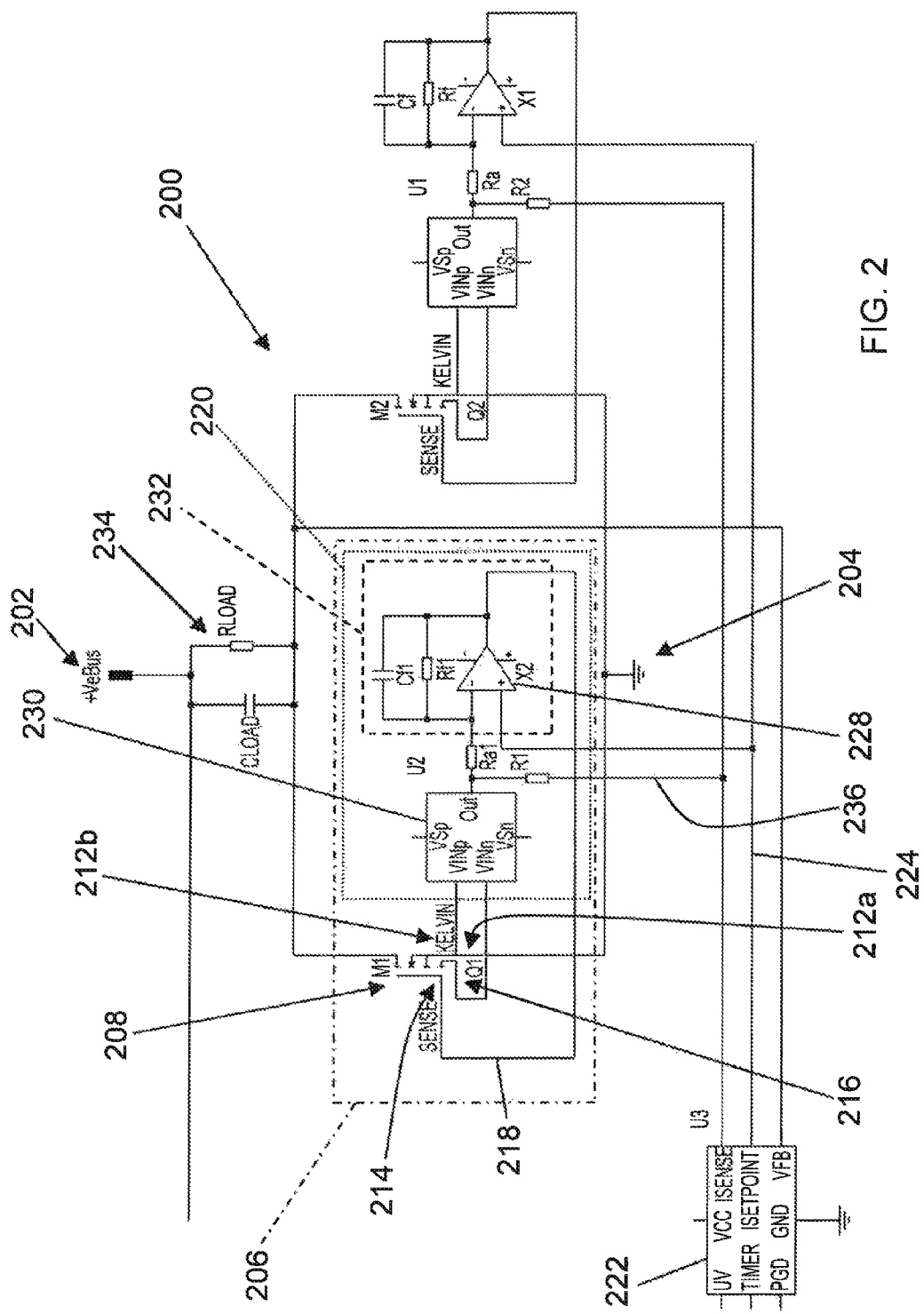

Embodiments will now be described by way of example with reference to the accompanying figures, in which:
  FIG. 1 illustrates a current control circuit; and
  FIG. 2 illustrates another current control circuit, Current-sensing power metal-oxide semiconductor field effect transistors (MOSFETs) provide a low loss method of measuring load current, in some examples eliminating the need for a current shunt resistor.

A sensing power MOSFET can include several thousand transistor cells on a common substrate arranged in parallel and sharing common drain and gate electrodes. Each transistor cell or element within the sensing power MOSFET is identical such that current applied at the drain terminal of the sensing power MOSFET is shared equally between them. In such designs, the source electrodes of several of the transistors are separated from the remaining source electrodes and connected to a separate source terminal. Accordingly, the resulting current-sensing MOSFETs can be thought of as equivalent to two transistors in parallel, these having common gate and drain terminals, but separate source terminals. The two transistors may he referred to as a main FET, which comprises the majority of the transistor cells, and a sense FET that comprises much fewer transistor cells. A sense ratio, n, is defined by the area of the main FET divided by the area of the sense FET. In use, the sense FET conducts only a small fraction of current applied to the common drain terminal, the fraction being inversely proportional to the sense ratio, n. More details on sensing power transistors are provided in the NXP application note AN10322 entitled "Current-sensing power MOSFETs", rev.02, 24 Jun. 2009, available on the NXP website at http://www.nxp.com/documents/application_note/AN10322.pdf.

FIG. 1 illustrates a current control circuit 100 for controlling current flow between a first terminal 102 and a second terminal 104, The circuit 100 includes a plurality of transistor modules 106 in parallel with each other between the first terminal 102 and the second terminal 104, In this example there are two transistor modules 106, although it will be appreciated that additional transistor modules 106 could be easily added to the circuit of FIG. 1. Also shown in FIG. 1 is a main controller 122.

Each transistor module 106 includes a sensing power MOSFET 108 and a local controller 120. The sensing power MOSFET 108, as described above, includes a main transistor and a sense transistor on a common substrate/die. The main transistor will be referred to as a main FET and the sense transistor will be referred to as a sense FET.

The main FET has a main drain, a main source 112 and a main gate. The sense FET has a sense drain, a sense source 116 and a sense gate, The main drain and the sense drain are provided as a common drain, which is shown with reference 110 in FIG. 1. The main gate and the sense gate are both connected to a local control terminal 114.

The main source 112 and the common drain 110 define a main source-drain path. The common drain 110 is connected to the first terminal 102. The main source 112 is connected to the second terminal 104. The sense source 116 and the common drain 110 define a sense source-drain path, The sense source 116 is configured to provide a local feedback signal 118 to the local controller 120.

The local controller 120 receives the local feedback signal 118 and also a main control signal 124 from the main controller 122. The main control signal 122 is representative of a desired current level for the transistor module 106. As described in more detail below, the main control signal 124 may be a fixed value that is set in accordance with the expected operating conditions of the current control circuit 100 or it may be dynamically set in accordance with measured parameters of the current control circuit 100.

The local controller 120 provides a local control signal 126 to the local control terminal 114 of the sensing power MOSFETs 108 in accordance with the local feedback signal 118 and the main control signal 124. The local control signal 126 controls the current through the main source-drain path and the sense source-drain path. For example, the voltage level at the gates of the main FET and sense FET can be set such that the current through the sensing power MOSFET 108 (as determined by the local feedback signal 118) tends towards a value that is represented by the main control signal 124.

Use of both the main control signal 124 and the local control signal 118 can enable the sensing power MOSFETs 103 to be controlled independently of the sensing power MOSFETs in the other transistor modules 106 such that they efficiently and effectively share the current serving requirements of the circuit 100. This may be in contrast to a circuit that does not have such control, in which case any variations between the sensing power MOSFETs 108 (for example due to tolerance variations between components) can lead to an imbalance in the current sharing between the sensing power MOSFETs 108, particularly at startup. For example, one of the sensing power MOSFETs 108 may start conducting before the others, which could lead to that sensing power MOSFET 108 passing more than its share of the total current if local control is not provided. This imbalance may lead to one or more of the sensing power MOSFETs 108 passing too much current such that its power exceeds its safe operating area (SOA), which could cause the sensing power MOSFET 108 to fail.

The current control circuit 100 can advantageously reduce the amount of power that is consumed in measuring the current through the circuit because high power sense resistors may not be used. Also, the likelihood that any of the sensing power MOSFETs 108 is operated outside of its safe operating (SOA) is reduced because of the improved current sharing that is enabled by the local control of each transistor module 106. Further advantages that follow from the reduced power consumption and improved current sharing include:

Improved efficiency due to reduced power consumption.
Better thermal management of the printed circuit board (PCB) as less power is being used for measuring the current, and therefore less heat is being generated.
Increased reliability of the current control circuit 100, and possibly associated circuits, as less heat is being generated in measuring the current.
Space saving of the PCB area because sense resistors may not be required and/or thermal management components may not be required.
Cost savings in running the current control circuit 100 due to the decreased power consumption of the circuit 100.

FIG. 2 illustrates another current control circuit 200 for controlling current flow between a first terminal 202 and a second terminal 204. Components in FIG. 2 that have corresponding components in FIG. 1 have been given similar reference numbers in the 200 series, and will not necessarily be described in detail again.

The plurality of transistor modules 206 are each provided in series with a common load 234 between the first terminal 202 and the second terminal 204, The local controller 220 of FIG. 2 includes a current to voltage converter 230 and an error amplifier and compensation block 232. The current to voltage converter 230 and the error amplifier and compensation block 232 may be provided on a single integrated circuit (IC), An example implementation of the current to voltage converter 230 is disclosed in US 2008/0191779 A1, the content of which is incorporated herein by reference, The main FET of the sensing power MOSFET 208 in this example includes two main source contacts: a high current source contact 212a, and a Kelvin source contact 212b.

The high current source contact 212a is provided by an impedance such as a bond wire such that it can handle relatively high currents. The Kelvin source contact 212b is connected to the main source of the main transistor in order to provide an accurate determination of the main transistor source potential, The Kelvin source contact 212b of the main FET is connected to a first input of the current to voltage converter 230, The sense source 216 of the sense FET is connected to a second input of the current to voltage converter 230. A purpose of the current to voltage converter 230 is to reliably and conveniently present the signal at the sense source 216 of the sense FET for subsequent processing. In this example, the current to voltage converter 230 includes a difference amplifier (not shown) with two inputs that respectively receive signals from the Kelvin source contact 212b of the main FET and the sense source 207 of the sense FET. The difference amplifier equalises the potential at the Kelvin source contact 212b of the main FET and the sense source 207 of the sense FET. In this way, a constant ratio between the amount of current that flows through the drain-source path of the sense FET and the amount of current that flows through the drain-source path of the main FET can be maintained and so the sense ratio, n, can be used to accurately calculate the total current flow through the sensing power MOSFET 208 using the determined current through the sense FET, The current to voltage converter 230 has an output that provides a signal representative of the current through the sense FET, The output of the current to voltage converter 230 is connected to an inverting input of an operational amplifier 228 in the error amplifier and compensation block 232. The main control signal 224 from the main controller 222 is provided as an input to a non-inverting input of the operational amplifier 228. The main control signal 224 is representative of a desired current level for the transistor module 206. The output of the operational amplifier 228 is representative of the difference between the main control signal 224 and the current through the sense FET.

It will be appreciated that the implementation of the error amplifier and compensation block 232 that is shown in FIG. 2 is exemplary, and that any other implementation can be used that provides the required functionality.

The main control signal 224 may be a fixed value that is set in accordance with the expected operating conditions of the current control circuit 100. The fixed value may be set by a user based on design parameters. For example, if a total current of 20A is desired through the load 234 then the main control signal 224 may be set such that each of the two sensing power MOSFETs 208 will contribute 10A.

Alternatively, the main control signal 224 may be dynamically set in accordance with measured parameters of the current control circuit 200. As shown in FIG. 2, a main feedback signal 236 is provided by the transistor module 206 to the main controller 222.

In this embodiment, the main feedback signal 236 is provided by the output of the current to voltage converter 230 and is representative of the current through the sensing power MOSFET 208. Each of the transistor modules 206 provides a similar main feedback signal 236. The main feedback signals 236 are combined together in this example, thereby adding together the individual current values, before being provided to a feedback terminal of the main controller 222. The feedback terminal of the main controller 222 in FIG. 2 is labeled as "ISENSE". The main controller 222 can then use the signal received at ISENSE to determine how much current should be allowed to flow through the sensing power MOSFETs 208 without exceeding their safe operating areas. The power that the MOSFET can handle without exceeding its safe operating area (SOA) is a function of the voltage dropped across the drain-source path of the sensing power MOSFET 208 (Vds) multiplied by the current at the drain of the sensing power MOSFET 208 (Id), along with thermal arrangement, time and secondary breakdown mechanisms. The SOA is typically represented by a graph. The main controller 222 can process the signal received at ISENSE in order to determine the power that is being applied to the sensing power MOSFETs 208 and then set the main control signal 224 such that current flow through the sensing power MOSFETs 208 is controlled such that the MOSFETs 208 operate within the SOA. In some examples the main controller 222 can process the signal received at SENSE along with the known resistance of the drain-source path of the sensing power MOSFETs 208 and/or a measured value of the voltage dropped across the sensing power MOSFETs 208 in order to determine the power that is being applied to the sensing power MOSFETs 208. In this way, the current flow through the sensing power MOSFETs 208 can be advantageously controlled such that the likelihood of component failure is reduced.

The main controller 222 may be provided as a simple adaption of existing controllers such as the LT4256 component from Linear Technology Corporation, or other controllers, such as those provided by Maxim Integrated, Texas Instruments, or Analog Devices, for example.

One or more of the examples disclosed herein can provide soft start/hot swap control, for applications where power-up current surges should be controlled. Such applications include examples where modules/boards can be plugged into a backplane in order to be connected to a power supply, such as in server systems and telecoms equipment. Examples can also include high power load switching applications where discharged capacitive loads are switched onto power rails. Also, examples disclosed herein can be used in soft start circuits for controlling a voltage supply to a capacitive load. MOSFET safe operating area can be a key parameter in these applications, and low $R_{DSON}$ the resistance between the common drain and the high current source contact when the main FET is on) can be important since it can helps to reduce power dissipation when the MOSFET is fully switched on.

It will be appreciated that any of the controllers disclosed herein can be analogue or digital controllers, The sensing power MOSFETs disclosed herein may be power FETs such as those described in the NXP application note AN10322. Also, the field effect transistors disclosed in NXP B.V.'s U.S. Pat. No. 7,737,507 B2 can have safe operating areas (SOAs) that are particularly suitable for one or more of the circuits disclosed herein, Any components that are described herein as being "coupled" or "connected" could be directly or indirectly coupled or connected. That is, one or more components could be located between two components that are said to be coupled or connected whilst still enabling the required functionality to be achieved.

The invention claimed is:

1. A current control circuit, comprising:
   a first terminal;
   a second terminal;
   a plurality of transistor modules in parallel with each other between the first terminal and the second terminal, each transistor module comprising:
   a main transistor having a main drain, a main source and a main gate, wherein the main source and the main drain define a main source-drain path, the main drain is coupled to the first terminal, the main source is coupled to the second terminal and the main gate is coupled to a local control terminal;
   a sense transistor having a sense drain, a sense source and a sense gate, wherein the sense source and the sense drain define a sense source-drain path, the sense drain is coupled to the first terminal, the sense gate is coupled to the local control terminal, and the sense source is configured to provide a local feedback signal;
   a local controller configured to:
   receive the local feedback signal and a main control signal; and
   provide a local control signal to the local control terminal in accordance with the local feedback signal and the main control signal in order to control the current through the main source-drain path and the sense source-drain path.

2. The current control circuit of claim 1, wherein the local controller is configured to determine the local control signal in accordance with a difference between the local feedback signal and the main control signal.

3. The current control circuit of claim 1, wherein the local feedback signal is representative of the current flowing through the sense transistor.

4. The current control circuit of claim 1, wherein the main control signal is representative of a desired current level for the sense transistor.

5. The current control circuit of claim 1, wherein the local controller of each of the plurality of transistor modules is configured to receive the same main control signal.

6. The current control circuit of claim 1, wherein the local control signal is configured to control the current such that the current through the sense source-drain path tends towards a desired current level represented by the main control signal.

7. The current control circuit of claim 1, wherein the main transistor and the sense transistor are provided on a common die.

8. The current control circuit of claim 7, wherein the main transistor and the sense transistor comprise a current sensing transistor.

9. The current control circuit of claim 1, wherein an area of the main transistor is at least an order of magnitude greater than an area of the sense transistor.

10. The current control circuit of claim 1, wherein the local controller includes a difference amplifier comprising:
two inputs that respectively receive signals from a Kelvin source contact of the main transistor and the sense source of the sense transistor; and
an output that provides the local feedback signal.

11. The current control circuit of claim 1, further comprising a main controller, wherein the local controller is configured to provide a main feedback signal to the main controller, and the main controller is configured to provide the main control signal in accordance with the main feedback signals received from the plurality of transistor modules.

12. The current control circuit of claim 11, wherein the main feedback signal is representative of the current through the sense transistor.

13. The current control circuit of claim 11, wherein the main controller is configured to:
determine, in accordance with the main feedback signal, a maximum power that can be applied to the main transistor and sense transistor such that they stay within their safe operating areas; and
set the main control signal in accordance with the determined maximum power.

14. A module configured for plugging into a backplane power supply, the module comprising the current control circuit of claim 1.

15. A soft start circuit for controlling a current flow to a capacitive load, the soft start circuit comprising the current control circuit of claim 1.

* * * * *